(12) United States Patent
Kang

(10) Patent No.: US 7,081,779 B2
(45) Date of Patent: Jul. 25, 2006

(54) RESET SIGNAL GENERATING CIRCUIT

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 394 days.

(21) Appl. No.: 10/734,130

(22) Filed: Dec. 15, 2003

(65) Prior Publication Data

US 2004/0239383 A1    Dec. 2, 2004

(30) Foreign Application Priority Data

May 30, 2003  (KR) ...................... 10-2003-0034709

(51) Int. Cl.
*H03L 7/00* (2006.01)
(52) U.S. Cl. ...................... 327/143; 327/142; 327/198
(58) Field of Classification Search ................ 327/142, 327/143, 198
See application file for complete search history.

(56) References Cited

U.S. PATENT DOCUMENTS

| 5,513,358 | A | * | 4/1996 | Lundberg et al. ........... 713/330 |
| 5,565,807 | A | * | 10/1996 | Ward .......................... 327/205 |
| 5,610,542 | A | * | 3/1997 | Kang et al. .................. 327/143 |
| 6,005,423 | A | * | 12/1999 | Schultz ....................... 327/143 |
| 6,067,244 | A | | 5/2000 | Ma et al. |
| 6,272,594 | B1 | | 8/2001 | Gupta et al. |
| 6,301,145 | B1 | | 10/2001 | Nishihara |
| 6,314,016 | B1 | | 11/2001 | Takasu |
| 6,329,852 | B1 | * | 12/2001 | Seo ............................ 327/143 |
| 6,363,439 | B1 | | 3/2002 | Battles et al. |

FOREIGN PATENT DOCUMENTS

| KR | 1999-0080861 A | 11/1999 |
| KR | 1019980014400 | 7/2000 |

* cited by examiner

*Primary Examiner*—Quan Tra
*Assistant Examiner*—Khareem E. Almo
(74) *Attorney, Agent, or Firm*—Heller Ehrman LLP

(57) ABSTRACT

The present invention discloses a reset signal generating circuit including a power sensing stabilizing unit, a pull-up driving unit, a voltage adjusting unit, a feedback control unit, a pull-up control unit, a self pull-up bias unit and a self bias unit. The reset signal generating circuit generates a reset signal only when a power voltage reaches a predetermined level, regardless of a power-up slope. In addition, the reset signal generating circuit includes a temperature compensating circuit to compensate for variations of operation properties of the voltage adjusting unit due to variations of a temperature, thereby minimizing instability of generation of the reset signal due to variations of the temperature.

20 Claims, 13 Drawing Sheets

RESET SIGNAL GENERATING CIRCUIT

BACKGROUND OF THE INVENTION

1. Field of the Invention

The present invention relates to a power-up reset circuit, and more particularly to a power-up reset circuit configured to make a reset signal insensible to variations of a power-up slope and a temperature, thereby improving stability of operations.

2. Description of the Background Art

In general, a ferroelectric random access memory (Fe-RAM) has a data processing speed equivalent to a dynamic random access memory (DRAM), and preserves data even when power is off.

The FeRAM is a memory having a similar tructure to the DRAM. The FeRAM employs a ferroelectric substance to form capacitors, and thus uses high remanent polarization which is a property of the ferroelectric substance. Even if electric fields are removed, data are not deleted in the FeRAM due to the remanent polarization.

The technical descriptions of the FeRAM have been disclosed in Korea Patent application No. 1998-14400 by the same inventors as the present invention. Therefore, detailed explanations of the basic structures and operation principles of the FeRAM are omitted.

In a system using the FeRAM as a memory element, when a system controller outputs a chip enable signal to an FeRAM chip, a memory of the FeRAM chip generates a chip internal control signal for operating a memory cell of the chip according to the chip enable signal. Data are recorded on the memory cell or read according to the chip internal control signal.

When power is initially supplied to the FeRAM, the system using the FeRAM must be reset by reading data stored in a code register. The read operation in the code register is performed by using a power-up reset signal.

In a conventional reset circuit, a power-up slope of voltage considerably influences generation of a reset signal. Therefore, when power gradually increases (when the power-up slope is small), the reset signal is generated even in a lower power voltage than a reference voltage.

FIG. 1 is a circuit diagram illustrating the conventional reset circuit.

Referring to FIG. 1, the reset circuit includes a PMOS transistor T1 having its gate terminal connected to a ground voltage terminal VSS, and an NMOS transistor T2 having its gate terminal connected to receive the output from the PMOS transistor T1, and its drain and source terminals commonly connected to the ground voltage terminal VSS. In addition, the reset circuit includes chained inverters INV1, INV2 and INV3 for sequentially inverting the output from the PMOS transistor T1, and a PMOS transistor T3 composing a latch with the inverter INV2.

A slope of the output signal RESET from the reset circuit is decided according to an RC delay time between the PMOS transistor T1 which is a pull-up current source having a channel resistance and the NMOS transistor T2 operating as a capacitor.

Accordingly, the power-up operation must be performed within a predetermined time to stably operate a memory chip. If the power-up time exceeds the predetermined time due to some factors generated in the code register, the data stored in the code register are destroyed.

FIGS. 2 and 3 are timing diagrams showing generation of the reset signal when the power voltage increases on a fast slope and a slow slope, respectively.

As illustrated in FIG. 2, when the power voltage rises from the ground voltage level VSS to the power voltage level Vcc on a fast slope, the reset signal is generated over a predetermined voltage. Conversely, as shown in FIG. 3, when the power voltage gradually rises from the ground voltage level VSS to the power voltage level Vcc on a slow slope, the NMOS transistor T2 is precharged for a longer time than FIG. 2, a sensing level of the NMOS transistor T2 is rapidly heightened, and thus the reset signal is generated in a low voltage.

As mentioned above, when generation of the reset signal is destabilized according to variations of the power voltage, the code register may be operated in a lower voltage than a normal voltage. When the code register is operated in a too low voltage, the data stored in the code register are mistakenly read or unstably restored, to cause failures in operations of the code register.

Moreover, properties of a semiconductor device are changed due to variations of a temperature, which destabilizes generation of the reset signal.

FIG. 4 is a diagram illustrating temperature properties of an NMOS/PMOS transistor.

As depicted in FIG. 4, when a temperature rises, a threshold voltage Vtn(-Vtp) of the NMOS/PMOS transistor decreases. As a result, the transistors are turned on even in a low power voltage, to generate the reset signal.

SUMMARY OF THE INVENTION

The present invention is achieved to solve the above problems. Accordingly, it is a primary object of the present invention to stably generate a reset signal in a predetermined power voltage level, regardless of a power-up slope of the power voltage.

Another object of the present invention is to stably generate a reset signal, regardless of variations of a temperature.

In order to achieve the above-described objects of the invention, there is provided a reset circuit including a power sensing stabilizing unit, a voltage adjusting unit, a feedback control unit, a self pull-up driving unit, a self pull-up bias unit and a self bias unit. The power sensing stabilizing unit senses variations of a power voltage, and outputs a signal proportional to variations of the power voltage until the power voltage reaches a specific level. The voltage adjusting unit drops the power voltage to a predetermined level, and outputs the power voltage. The feedback control unit controls the output from the power sensing stabilizing unit according to the output from the voltage adjusting unit, and generates a reset signal by pulling down the output signal from the power sensing stabilizing unit when the output from the voltage adjusting unit reaches the specific level. The self pull-up driving unit maintains a pull-down state of the output from the power sensing stabilizing unit, by pulling up the output from the voltage adjusting unit to the power voltage level after generation of the reset signal according to a self bias gate voltage. The self pull-up bias unit outputs the self bias gate voltage according to variations of the power voltage. The self bias unit drops the self bias gate voltage from a specific self bias gate voltage level.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Preferred embodiments of the present invention will now be described in detail with reference to the accompanying drawings.

Figure 5:
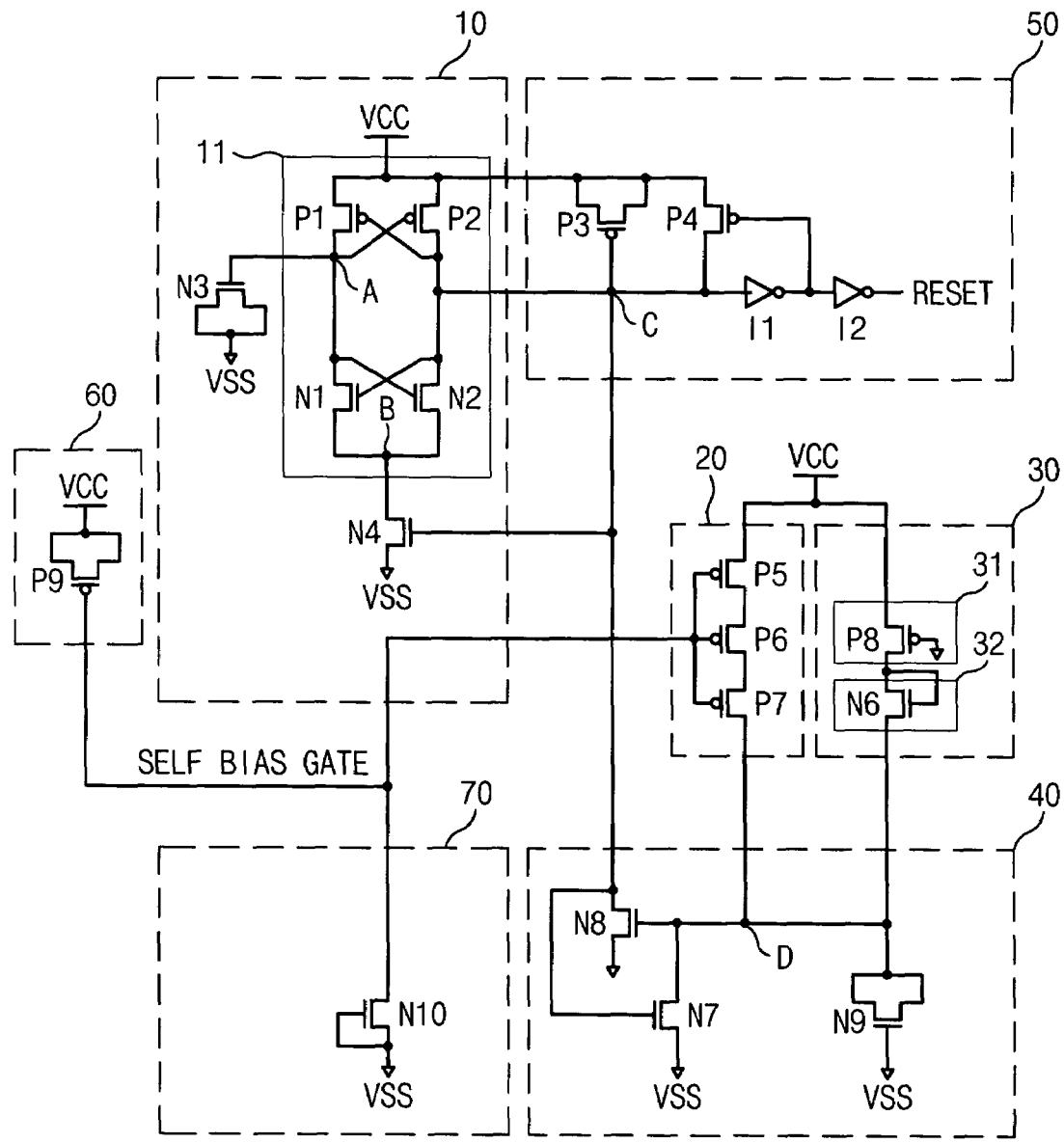
FIG. 5 is a circuit diagram illustrating a reset circuit in accordance with a first embodiment of the present invention.

FIG. 5 is a circuit diagram illustrating a reset circuit in accordance with a first embodiment of the present invention.

The reset circuit includes a power sensing stabilizing unit 10, a self pull-up driving unit 20, a voltage adjusting unit 30, a feedback control unit 40, a pull-up control unit 50, a self bias unit 60 and a self pull-up bias unit 70.

The power sensing stabilizing unit 10 senses variations of a power voltage Vcc, and outputs a signal varied identically to the power voltage Vcc until the power voltage Vcc reaches a predetermined level.

The power sensing stabilizing unit 10 includes a latch circuit 11 and NMOS transistors N3 and N4. The latch circuit 11 maintains a magintude of the power voltage Vcc for a predetermined period. The latch circuit 11 includes a PMOS transistor P1 and an NMOS transistor Ni which are connected in series between a power voltage terminal Vcc and a node B, and which have their gate terminals connected to a node C, and a PMOS transistor P2 and an NMOS transistor N2 which are connected in series between the power voltage terminal Vcc and the node B, and which have their gate terminals connected to a node A. The NMOS transistor N3 is connected between the first node A of the latch circuit 11 and a ground voltage terminal VSS, for fixing the first node A to a low level before power is supplied to the latch circuit 11. The NMOS transistor N4 is a latch enable gate which is connected between the second node B of the latch circuit 11 and the ground voltage terminal VSS, and which has its gate terminal connected to the third node C which is an output terminal of the latch circuit 11.

The self pull-up driving unit 20 pulls up a voltage of a node D to a power voltage level after generation of a reset signal, by controlling current supply to a node D according to a self bias gate voltage. That is, the self pull-up driving unit 20 restricts current supply to the node D according to the self bias gate voltage at the early stage of the operation, namely until the power voltage Vcc reaches the predetermined level. When the power voltage Vcc is over the predetermined level, the self pull-up driving unit 20 pulls up the voltage of the node D to the power voltage Vcc level by supplying current to the node D.

The self pull-up driving unit 20 includes a plurality of PMOS transistors P5, P6 and P7 which are connected in series between the power voltage terminal Vcc and the node D, and which have their gate terminals commonly connected to the self bias gate.

The voltage adjusting unit 30 drops the power voltage Vcc to a predetermined level to be outputted to the node D, and thus decides a voltage level for generation of the reset signal. The voltage adjusting unit 30 includes a voltage micro-adjusting unit 31 and a voltage dropping unit 32. The voltage dropping unit 32 drops the power voltage Vcc in certain units Vtn. The voltage micro-adjusting unit 31 micro-adjusts current flow according to a ratio W/L of a width to length of a channel of a MOS transistor, and thus micro-adjusts the output voltage from the voltage adjusting unit 30 in smaller units than the units Vtn of the voltage dropping unit 32.

The voltage adjusting unit 30 includes a PMOS transistor P8 and an NMOS transistor N6 which are connected in series between the power voltage terminal Vcc and the node D, and which have their gate terminals connected respectively to the ground voltage terminal VSS and the drain terminal.

The feedback control unit 40 controls the output from the power sensing stabilizing unit 10 according to the output voltages from the sense pull-up driving unit 20 and the voltage adjusting unit 30. That is, when the power voltage Vcc increases and the output from the voltage adjusting unit 30 reaches a predetermined level, the feedback control unit 40 generates the reset signal by pulling down the output from the power sensing stabilizing unit 10. In addition, the feedback control unit 40 stably maintains the output from the power sensing stabilizing unit 10 in a low level according to the output voltage from the self pull-up driving unit 20.

The feedback control unit 40 includes an NMOS transistor N7 which is connected between the node D and the ground voltage terminal VSS, and which has its gate terminal connected to the node C, an NMOS transistor N8 which is connected between the node C and the ground voltage terminal VSS, and which has its gate terminal connected to the node D, and an NMOS transistor N9 which has its drain and source terminals commonly connected to the node D and its gate terminal connected to the ground voltage terminal VSS.

The pull-up control unit 50 pulls up the output voltage from the power sensing stabilizing unit 10 to the power voltage Vcc level at the initial stage of the operation, and outputs variations of the output voltage from the power sensing stabilizing unit 10 as a reset signal.

The pull-up control unit 50 includes a PMOS transistor P3 having its drain and source terminals commonly connected to the power voltage terminal Vcc and its gate terminal connected to the node C, an inverter I1 for inverting the signal of the node C, a PMOS transistor P4 which is connected between the power voltage terminal Vcc and the node C, and which has its gate terminal connected to the output terminal of the inverter I1, and an inverter I2 for inverting the output signal from the inverter I1 and outputting the reset signal.

The self pull-up bias unit 60 outputs the self bias gate voltage, and pulls up the voltage of the common gate terminals of the self pull-up driving unit 20 according to rise of the power voltage Vcc. The self pull-up bias unit 60 increases the gate voltage of the self pull-up driving unit 20 according to increase of the power voltage Vcc, and thus intercepts current supply to the node D by the self pull-up driving unit 20 until the power voltage Vcc reaches the specific level.

The self pull-up bias unit 60 has its source and drain terminals commonly connected to the power voltage terminal Vcc, and its gate terminal connected to the gate terminals of the self pull-up driving unit 20.

The self bias unit 70 serves as a diode for dropping the self bias gate voltage, by generating leakage current when the self bias gate voltage reaches the specific level. When the self bias gate voltage is dropped by the self bias unit 70, the gate voltage of the self pull-up driving unit 20 is also dropped. When the gate voltage of the self pull-up driving unit 20 is dropped, current is supplied to the node D by the self pull-up driving unit 20, and thus the voltage of the node D is gradually pulled up to the power voltage Vcc level.

The self bias unit 70 includes an NMOS transistor N10 which is connected between the commonly-connected gate terminals of the self pull-up driving unit 20 and the ground voltage terminal Vss, and which has its gate terminal commonly connected to its source terminal.

Figure 6:
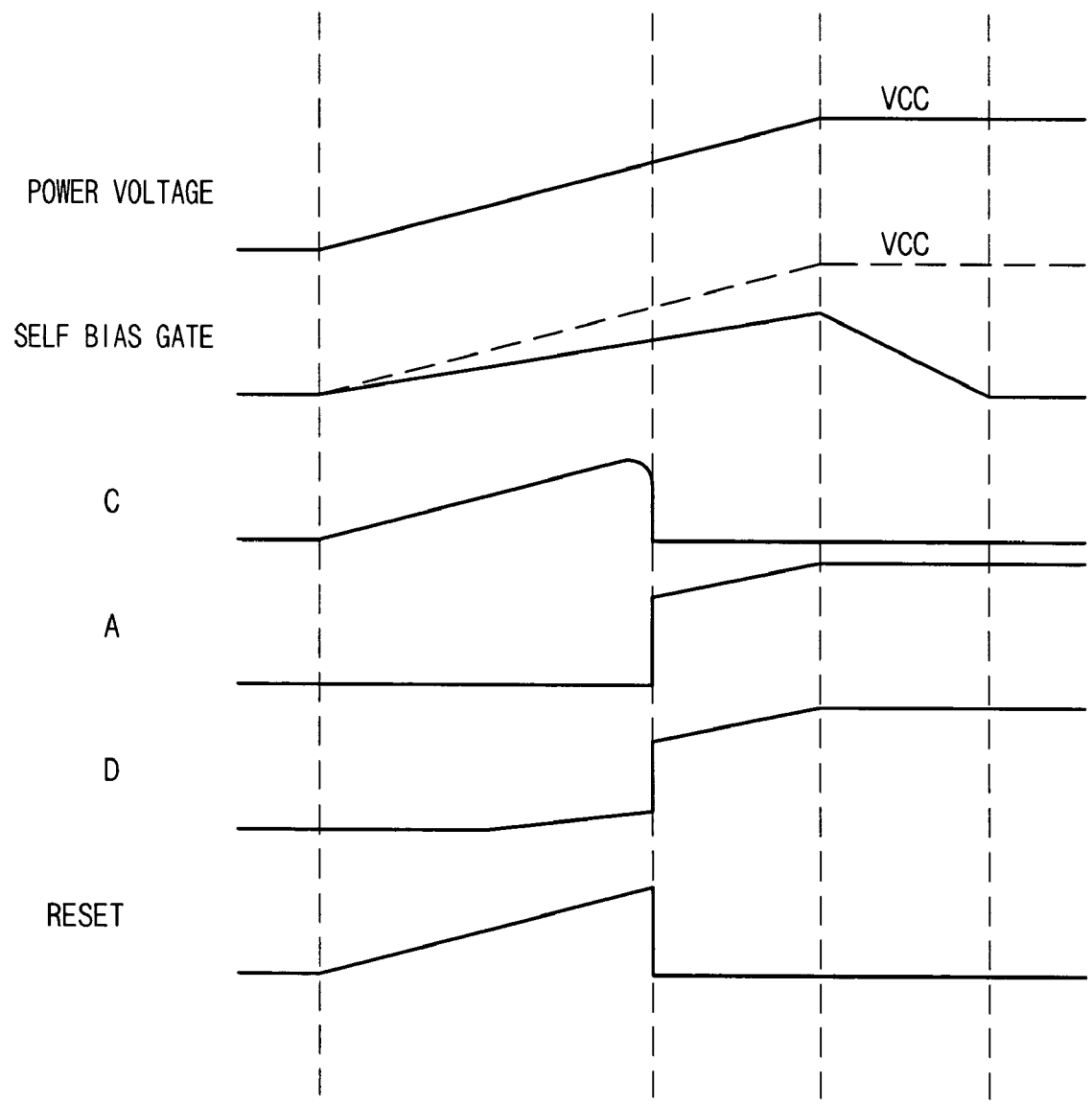
FIG. 6 is an operation waveform diagram of a reset signal generating unit of FIG. 5.

FIG. 6 is an operation waveform diagram of the reset signal generating unit of FIG. 5. The operation of the reset signal generating unit will now be described in more detail with reference to FIG. 6.

At the initial stage of the operation, the node A is fixed to a low level by the NMOS transistor N3. When the power voltage Vcc increases, more current is supplied to the node C by the PMOS transistor P2, to increase the voltage of the node C.

When the voltage of the node C increases to turn on the NMOS transistor N4 which is the latch enable gate, the node A stably maintains a low level, and the node C maintains a high level due to increase of the power voltage Vcc. In addition, the NMOS transistor N7 is turned on due to the high level of the node C, and thus the node D stably has a low level.

In accordance with the present invention, the reset signal is generated due to variations of the voltage of the node C, and variations of the voltage of the node C are decided by the voltage of the node D. Accordingly, it is very important to stably maintain the voltage of the node D in a low level until the power voltage Vcc reaches the predetermined level for generation of the reset signal.

The voltage of the node D is initially maintained in a low level by the NMOS transistors N9 and N7. However, as the power voltage Vcc gradually increases, the magnitude of the voltage of the node D is determined depending on current leaked from the node D by the feedback control unit 40 and current supplied to the node D by the self pull-up driving unit 20 and the voltage adjusting unit 30.

When the power voltage Vcc gradually increases, more current is supplied to the node D by the voltage adjusting unit 30. The voltage adjusting unit 30 generates a voltage dropped from the power voltage Vcc by a predetermined level in the node D according to increase of the power voltage Vcc. That is, the voltage dropping unit 32 drops the power voltage Vcc in certain units Vtn, and the voltage micro-adjusting unit 31 micro-adjusts the voltage of the node D in smaller units than the certain units Vtn, by adjusting a size of the PMOS transistor P8.

However, until the power voltage Vcc reaches the predetermined level, the node D receives current by only the voltage adjusting unit 30. The, node D maintains a low level due to current supply by the voltage adjusting unit 30 and current leakage by the feedback control unit 40. When the voltage of the node D maintains a low level, the NMOS transistor N8 has an off state.

When the power voltage Vcc is over the predetermined level, the self pull-up driving unit 20 starts to supply current to the node D. When current supply by the voltage adjusting unit 30 and the self pull-up driving unit 20 is greater than current leakage by the feedback control unit 40, the voltage of the node D is transited to a high level. When the voltage of the node D is transited to a high level, the NMOS transistor N8 is turned on to pull down the voltage of the node C. When the voltage of the node C is pulled down, the pull-up control unit 50 generates the reset signal. In addition, when the voltage of the node C is pulled down, the NMOS transistor N7 is turned off, and thus current leakage of the node D by the NMOS transistor N7 is intercepted. As a result, the voltage of the node D more stably maintains a high level.

After generation of the reset signal, the voltage of the node D needs to be pulled up to the power voltage Vcc level to stabilize the reset signal. It is performed by the self pull-up driving unit 20.

At the initial stage of the operation, the voltage of the node D may increase due to increase of the power voltage Vcc and leakage current by the PMOS transistors P5, P6 and P7. When the voltage of the node D increases to turn on the NMOS transistor N8, the voltage of the node C is pulled down even in a low power voltage, to generate the reset signal.

Therefore, in order to stably maintain the voltage of the node D in a low level at the early stage of the operation, the reset circuit includes the self pull-up bias unit 60 and the self bias unit 70 for intercepting current supply to the node D by the self pull-up driving unit 20, regardless of increase of the power voltage Vcc, until the power voltage Vcc reaches the predetermined level.

The self pull-up bias unit 60 transmits the power voltage Vcc to the gate terminals of the PMOS transistors P5, P6 and P7 as an NMOS capacitor. That is, when the power voltage Vcc increases, the self pull-up bias unit 60 intercepts current supply to the node D by restricting leakage current generation in the PMOS transistors P5, P6 and P7, by increasing the gate voltages of the PMOS transistors P5, P6 and P7. However, when the power voltage Vcc increases and the self bias gate voltage reaches the specific level, the voltages of the gate terminals of the PMOS transistors P5, P6 and P7 are gradually reduced due to leakage current by the self bias unit 70. Accordingly, the PMOS transistors P5, P6 and P7 start to supply current to the node D, which rapidly increases the voltage of the node D. Therefore, the NMOS transistor N8 is turned on to pull down the voltage of the node C, thereby generating the reset signal. Moreover, when the voltage of the node C is pulled down to turn off the NMOS transistor N7, the voltage of the node D more stably maintains a high level.

Before the power voltage Vcc increases, the node D maintains a low level by the NMOS transistor N9 for loading so as to turn off the NMOS transistor N8 at the early stage of the operation.

Figure 7:
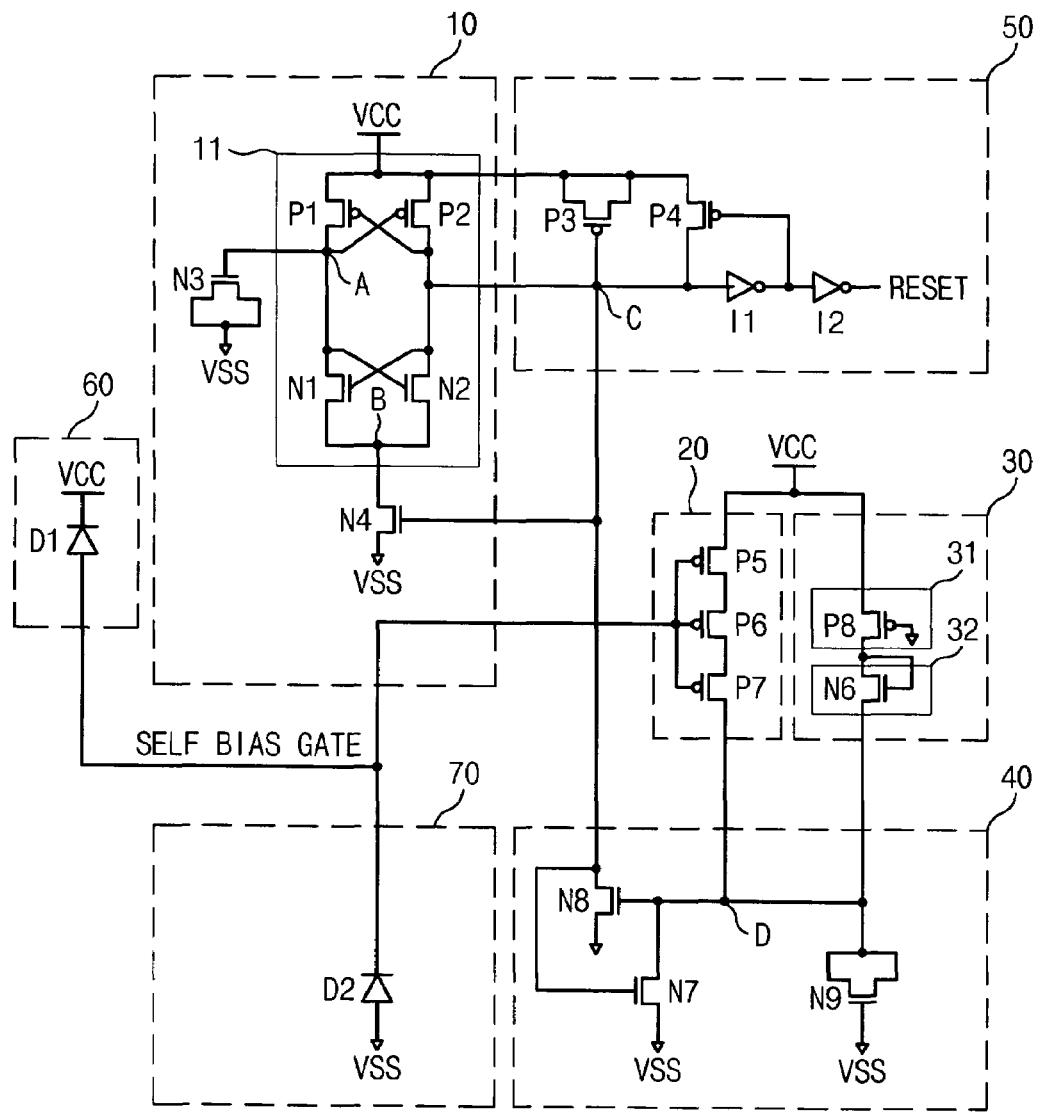
FIG. 7 is a circuit diagram illustrating a reset circuit in accordance with a second embodiment of the present invention.

FIG. 7 is a circuit diagram illustrating a reset circuit in accordance with a second embodiment of the present invention.

As illustrated in FIG. 7, diodes D1 and D2 are used as a self pull-up bias unit 61 and a self bias unit 71, respectively. The other constitutional elements are identical to FIG. 5, and thus same reference numerals are used. The operation principle is identical to FIG. 5, and thus detailed explanations thereof are omitted.

Figure 1:
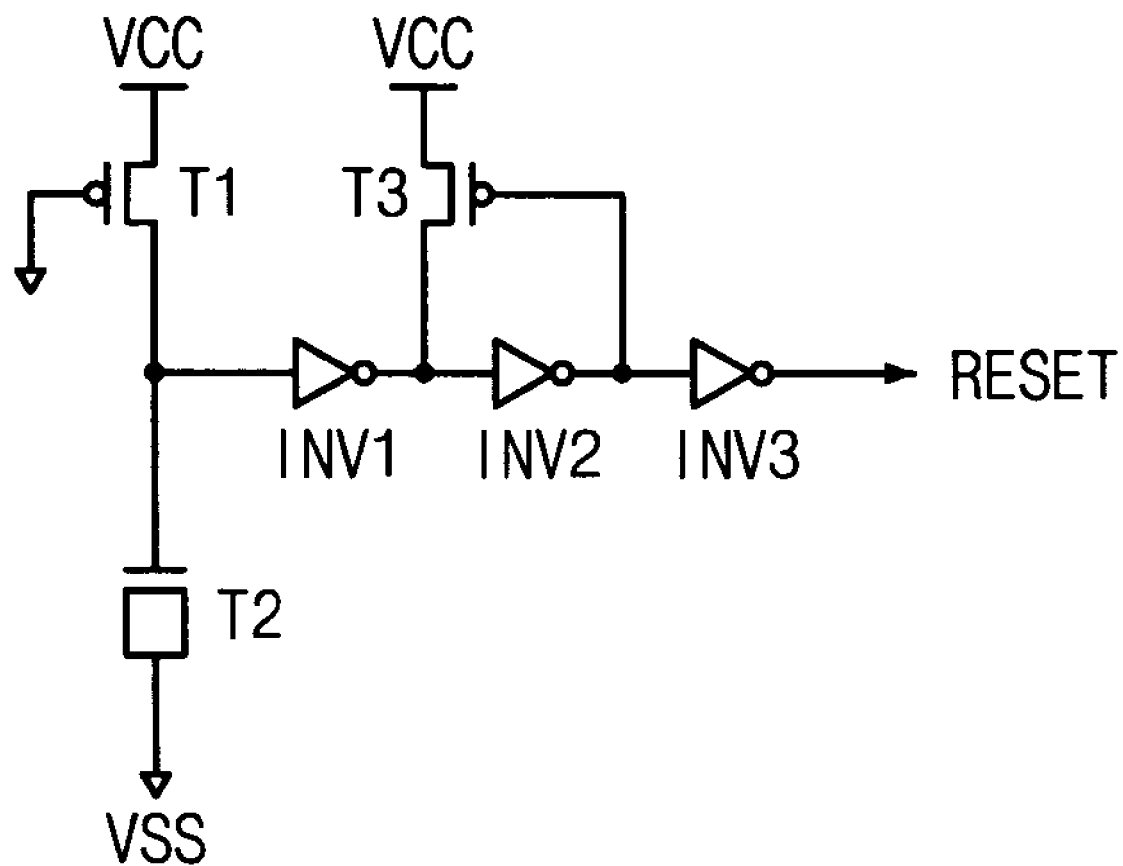
FIG. 1 is a circuit diagram illustrating a conventional reset circuit.
Figure 2:
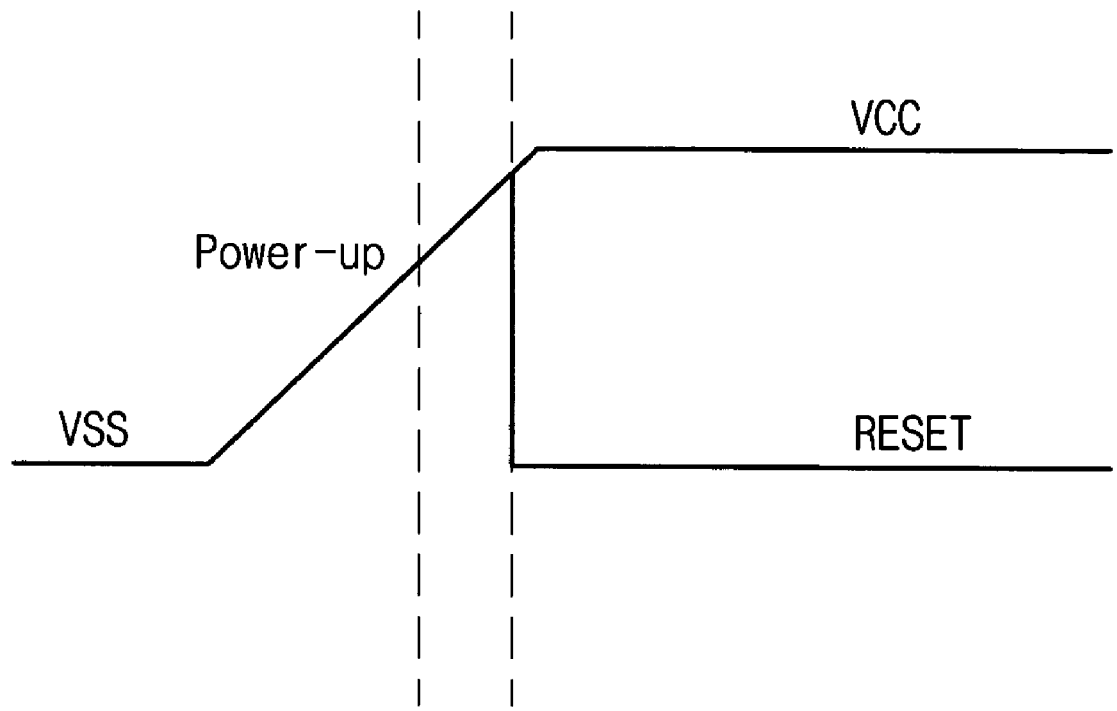
FIG. 2 is a timing diagram showing generation of a reset signal when a power voltage increases on a fast slope.
Figure 3:
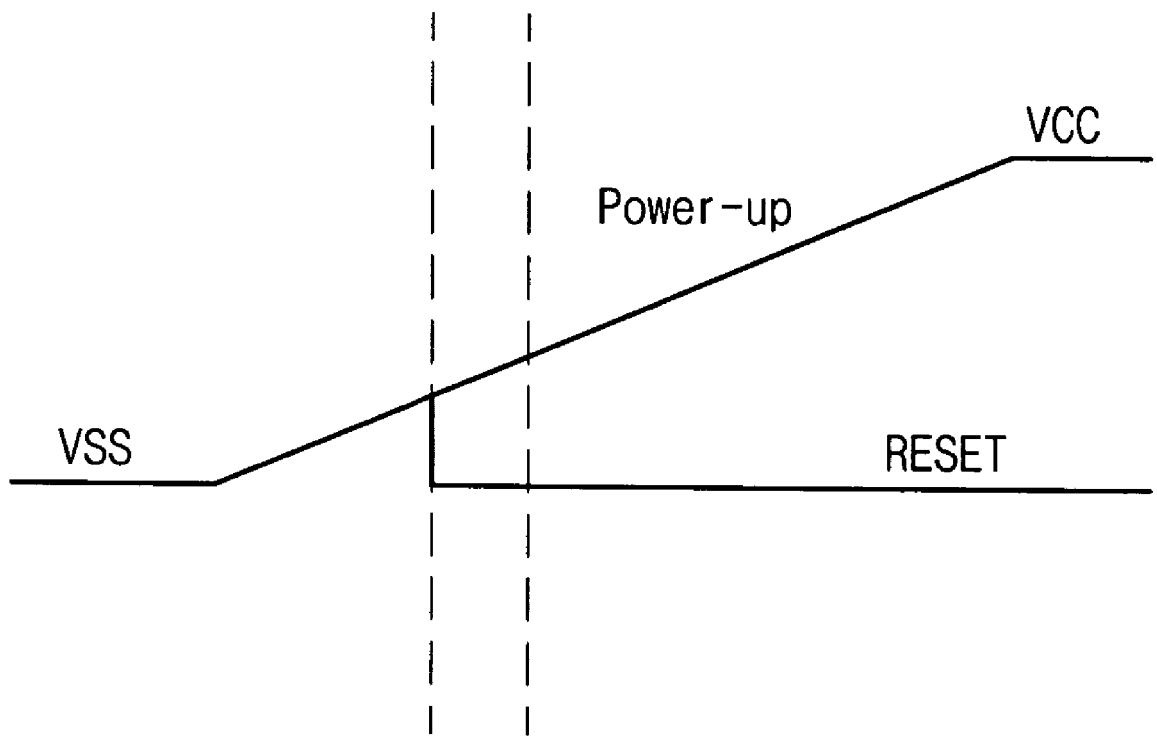
FIG. 3 is a timing diagram showing generation of the reset signal when the power voltage increases on a slow slope.
Figure 4:
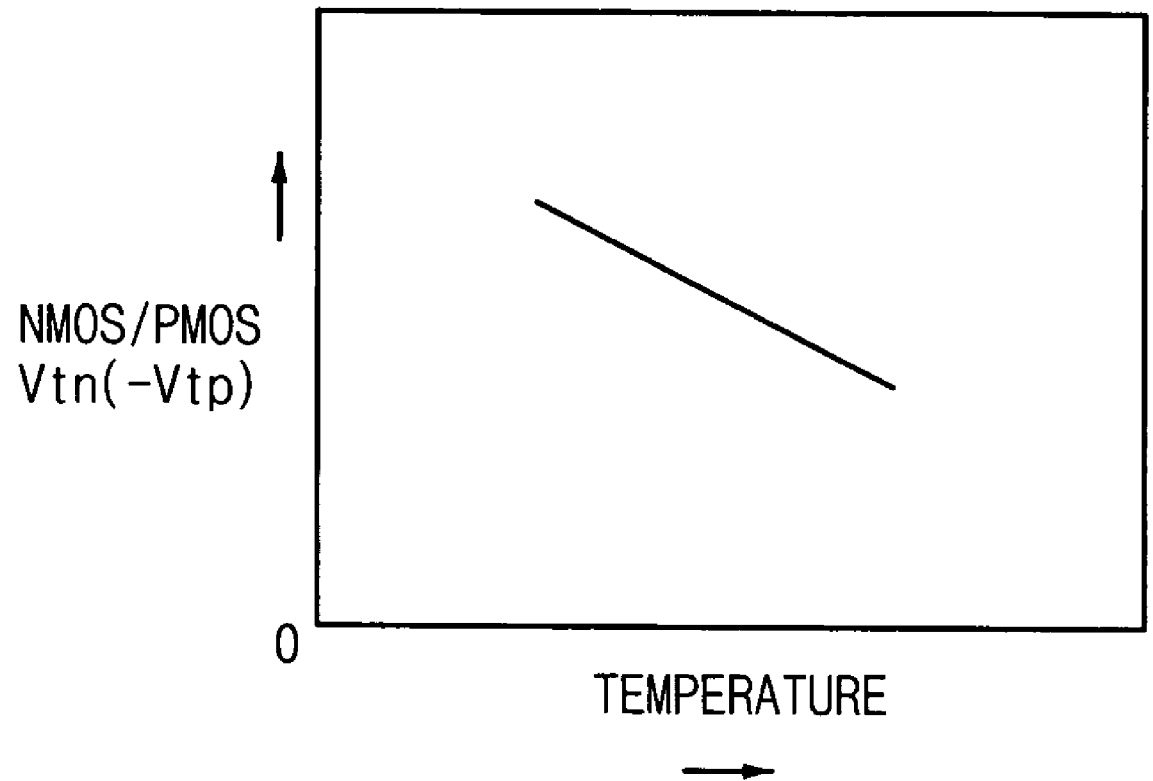
FIG. 4 is a diagram illustrating temperature properties of an NMOS/PMOS transistor.

On the other hand, in the reset circuit, generation of the reset signal may also be influenced when a temperature of the elements rises due to variations of an outside temperature. In general, when the temperature rises, a threshold voltage Vtn(-Vtp) of the NMOS/PMOS transistor is changed as shown in FIG. 4. Therefore, more current is supplied to the node D by the voltage adjusting unit 30, and thus the reset signal is generated even in a low power voltage.

In accordance with the present invention, temperature compensating circuits for compensating for variations of operation properties of transistors due to variations of a temperature can be selectively formed with the intention of the manufacturer.

Figure 8A:
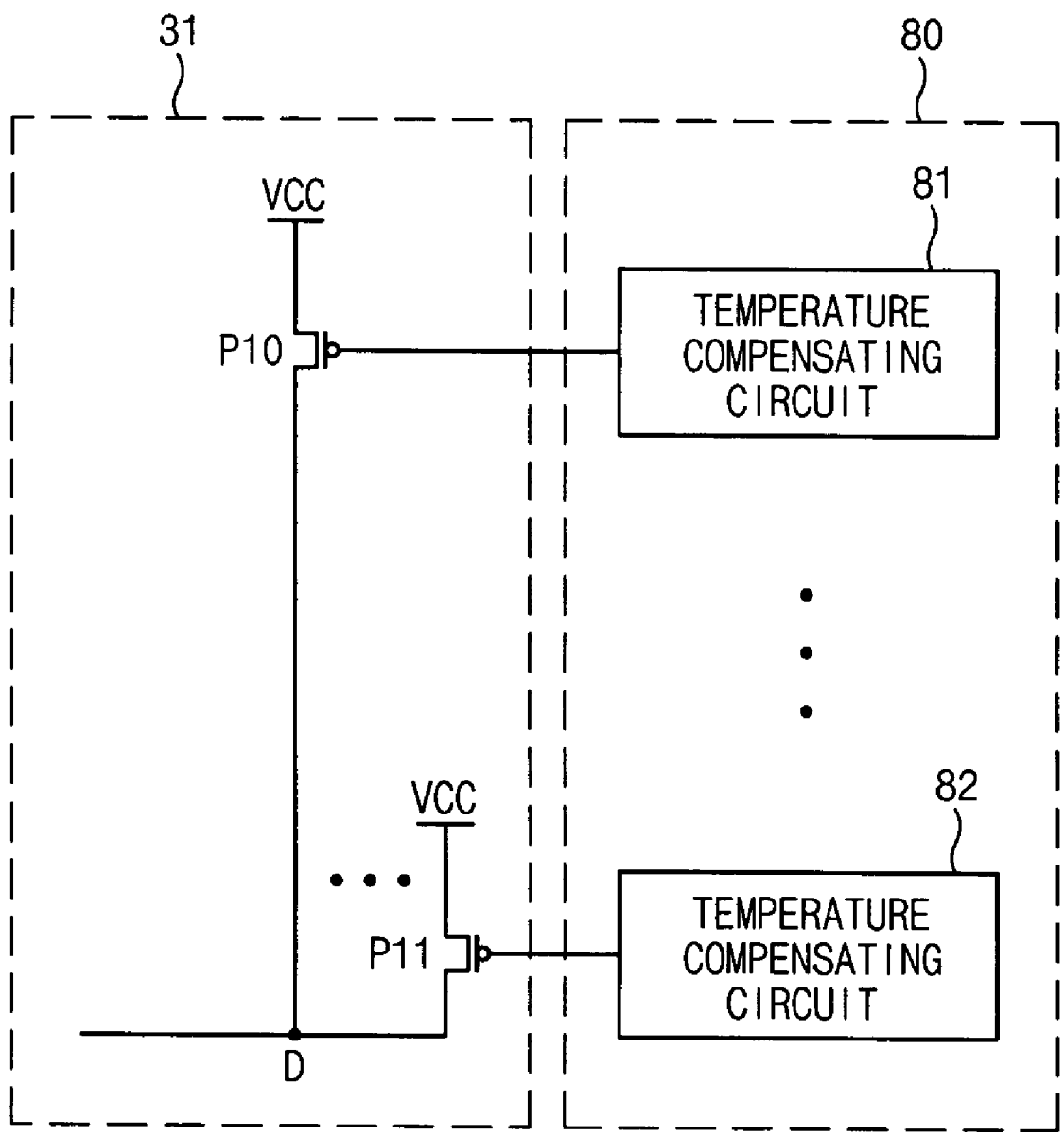
FIG. 8*a* is a circuit diagram illustrating a temperature compensating circuit area of a reset circuit in accordance with a third embodiment of the present invention.
Figure 8B:
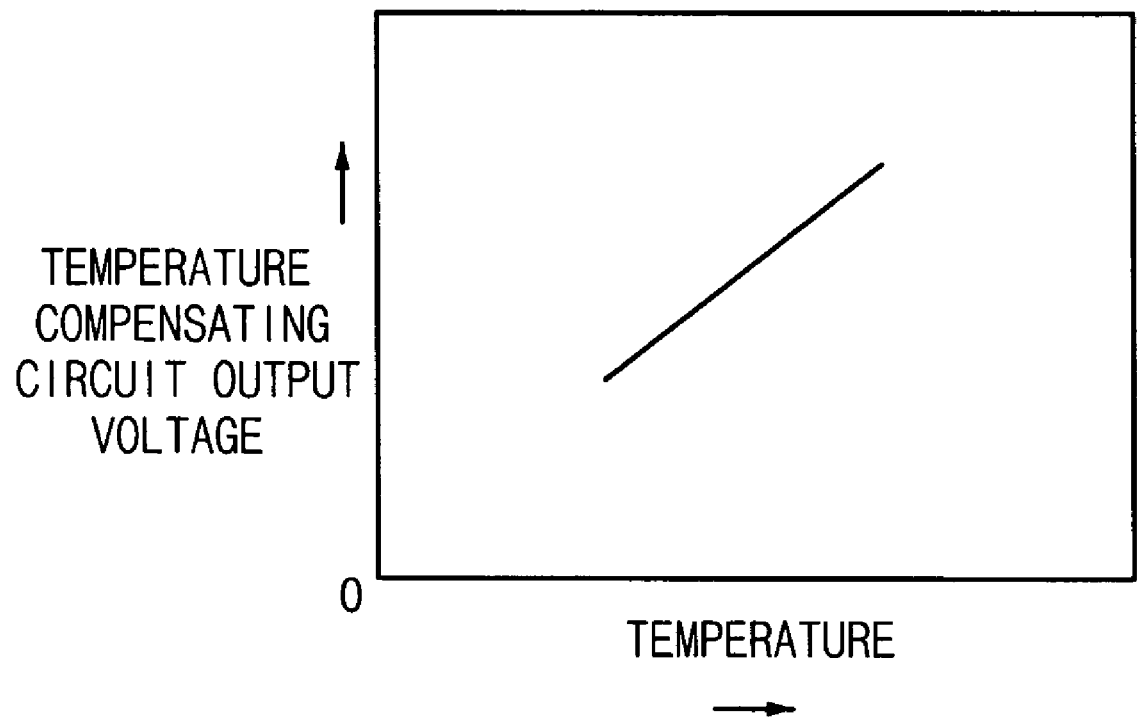
FIG. 8*b* is a diagram illustrating temperature properties of the temperature compensating circuit of FIG. 8*a*.

FIGS. 8a and 8b are circuit diagrams illustrating a third embodiment of the present invention. Temperature compensating circuits 81 and 82 are added to a voltage adjusting unit 33, so that generation of a reset signal cannot be seriously influenced by variations of a temperature.

Here, FIG. 8a is a circuit diagram illustrating a temperature compensating circuit area (voltage adjusting unit). The other constitutional elements are identical to FIG. 5 or 7.

For convenience's sake, the voltage adjusting unit 33 includes at least one or more PMOS transistors P10 and P11 connected in parallel between a power voltage terminal Vcc and a node D.

A temperature compensating unit 80 minimizes variations of current supplied to the node D by the voltage adjusting unit 33 due to variations of the temperature, by changing the gate voltages of the PMOS transistors P10 and P11 according to variations of the temperature. That is, when the temperature rises and threshold voltages Vtp of the PMOS transistors P10 and P11 increase, as shown in FIG. 8b, the output voltages from the temperature compensating circuits 81 and 82 are heightened to increase the gate voltages of the PMOS transistors P10 and P11.

Referring to FIG. 8a, in order to more micro-adjust the temperature by changing parameters, the plurality of PMOS transistors P10 and P11 are connected in parallel between the power voltage terminal Vcc and the node D in the voltage adjusting unit 33, and the plurality of temperature compensating circuits 81 and 82 are formed in the temperature compensating unit 80 to correspond to the PMOS transistors P10 and P11.

Figure 9:
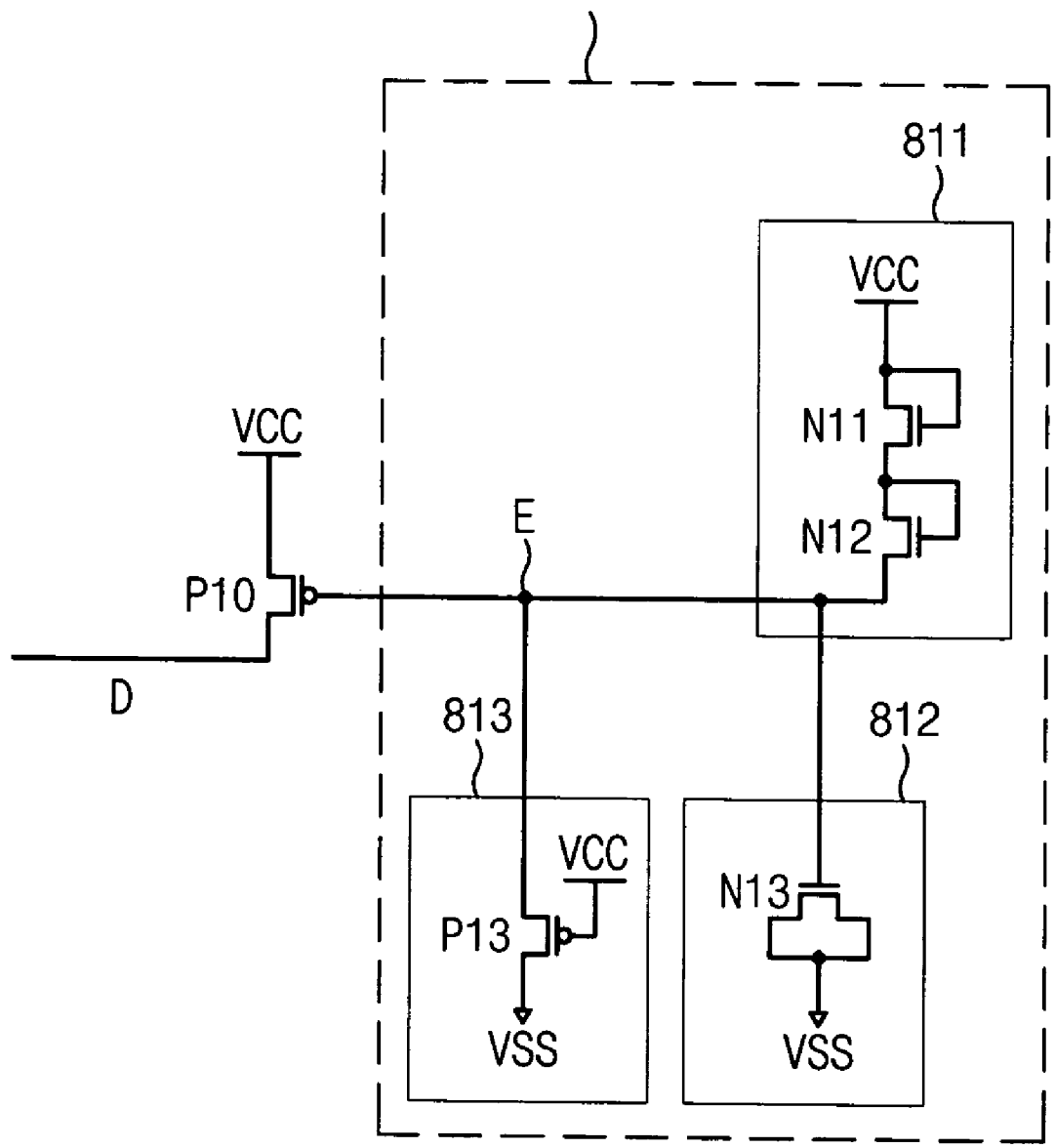
FIG. 9 is a circuit diagram illustrating the temperature compensating circuit in accordance with the present invention.

FIG. 9 is a circuit diagram illustrating the temperature compensating circuit 81 in accordance with the present invention.

The temperature compensating circuits 81 and 82 have the same structure, and thus one of them will now be explained.

In this embodiment, the temperature compensating circuit 81 includes a temperature sensing voltage dropping unit 811, a voltage stabilizing unit 812 and a voltage precharge unit 813.

The temperature sensing voltage dropping unit 811 variably drops the power voltage Vcc according to variations of the temperature, and outputs the power voltage Vcc to a node E. The temperature sensing voltage dropping unit 811 includes NMOS transistors N11 and N12 which are connected in series between the power voltage terminal Vcc and the node E, and which have gate and drain terminals commonly connected.

The voltage stabilizing unit 812 allows the node E to stably have the ground voltage VSS level at the early stage of the operation. The voltage stabilizing unit 812 includes an NMOS transistor N13 having its drain and source terminals commonly grounded and its gate terminal connected to the node E.

When the power voltage Vcc is reduced in precharge and the gate voltage of the PMOS transistor P10 is identical to the ground voltage VSS, the voltage precharge unit 813 pulls down the node E. The voltage precharge unit 813 includes a PMOS transistor P13 which is connected between the node E and the ground voltage VSS, and which has its gate terminal connected to the power voltage Vcc.

At the early stage of the operation, the node E is stabilized to the ground voltage VSS by the voltage stabilizing unit 812. When the power voltage Vcc increases, the temperature sensing voltage dropping unit 811 reduces the power voltage Vcc by 2 V tn and outputs the power voltage Vcc. However, when the temperature rises, as shown in FIG. 4, the threshold voltage Vtp of the PMOS transistor P10 increases, and thus less current is supplied to the node D by the voltage adjusting unit 33.

Here, the threshold voltages Vtn of the NMOS transistors N11 and N12 of the temperature sensing voltage dropping unit 811 decrease due to rise of the temperature, and thus the voltage of the node E, namely the gate voltage of the PMOS transistor P10 increases. That is, when the threshold voltage Vtp of the PMOS transistor P10 of the voltage adjusting unit 33 is heightened due to rise of the temperature, the temperature compensating circuit 81 increases the gate voltage thereof, thereby compensating for property variations of the voltage adjusting unit 33 due to rise of the temperature.

Accordingly, influences of the variations of the temperature on the voltage of the node D are minimized, to stably output the reset signal.

Figure 10A:
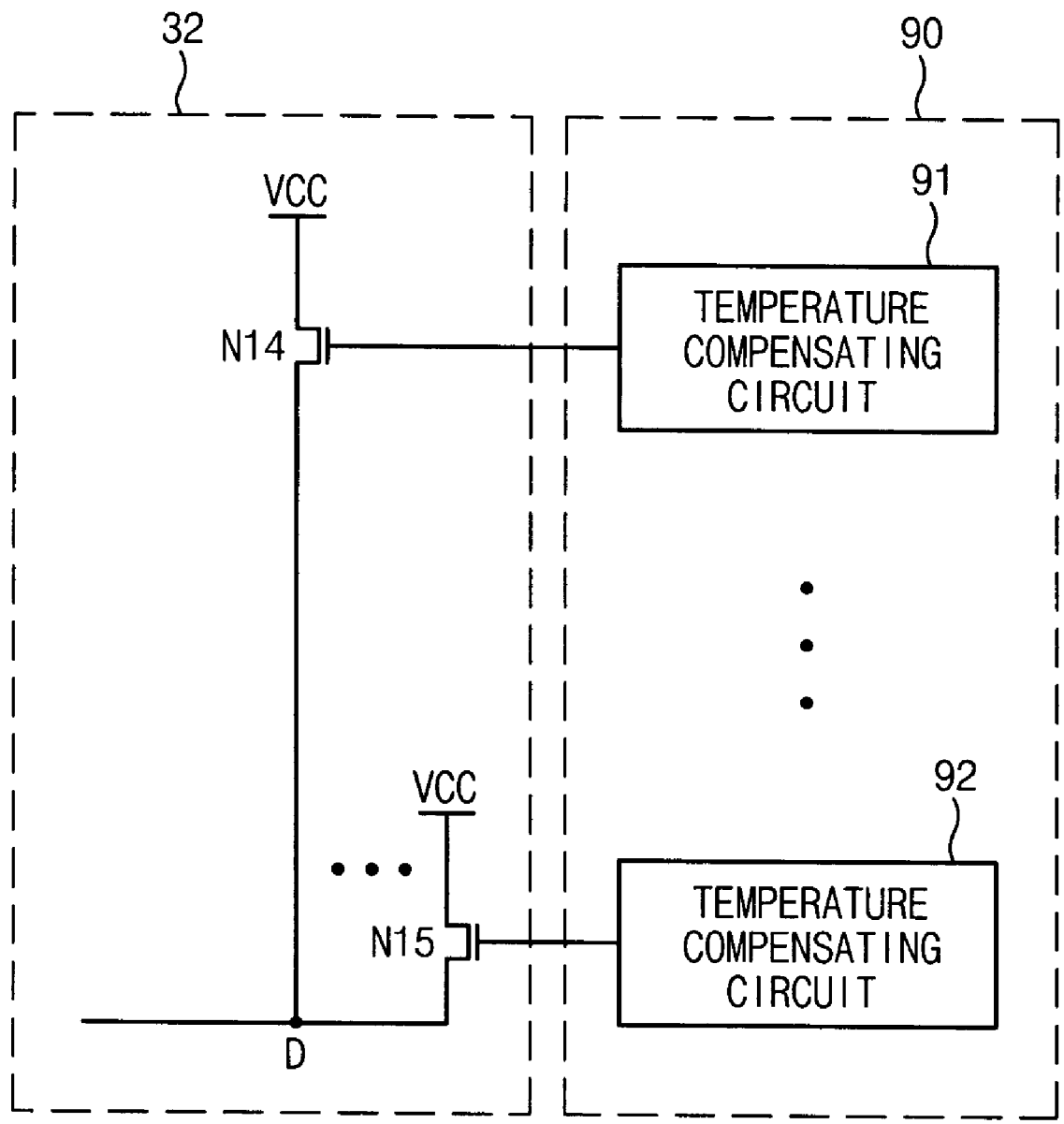
FIG. 10*a* is a circuit diagram illustrating a temperature compensating circuit area of a reset circuit in accordance with a fourth embodiment of the present invention.

FIG. 10a is a circuit diagram illustrating a temperature compensating circuit area (voltage adjusting unit) of a reset circuit in accordance with a fourth embodiment of the present invention. The other constitutional elements are the same as FIG. 5 or 7.

Differently from FIG. 8a, a voltage adjusting unit 34 includes at least one or more NMOS transistors N14 and N15 connected in parallel between a power voltage terminal Vcc and a node D.

When a temperature rises, threshold voltages Vtn of the NMOS transistors N14 and N15 decrease. Therefore, more current is supplied to the node D by the voltage adjusting unit 34 even in a low power voltage, and thus the reset signal is generated in the low power voltage.

Figure 10B:
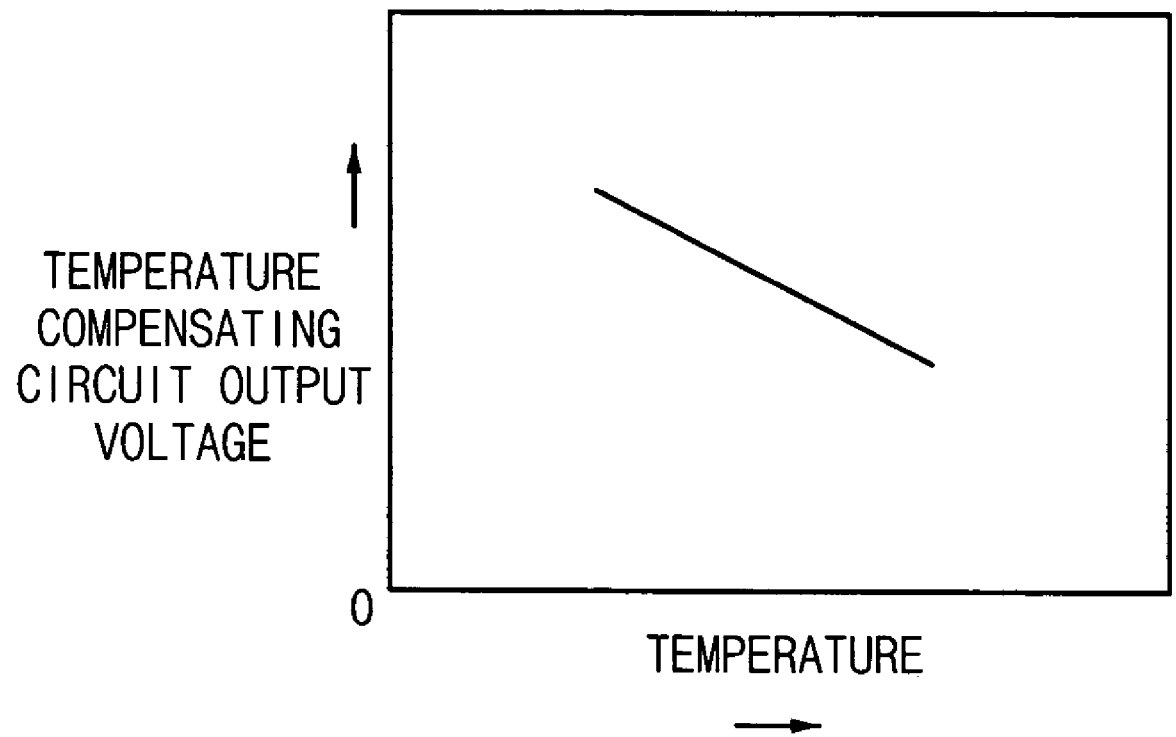
FIG. 10*b* is a diagram illustrating temperature properties of the temperature compensating circuit of FIG. 10*a*.

In this case, as shown in FIG. 10b, an output voltage from a temperature compensating circuit 91 is lowered and supplied to the gate terminals of the NMOS transistors N14 and N15.

In FIG. 10a, in order to micro-adjust the temperature by changing parameters, a plurality of temperature compensating circuits 91 and 92 are formed in a temperature compensating unit 90 to correspond to the NMOS transistors N14 and N15 connected in parallel.

Figure 11:
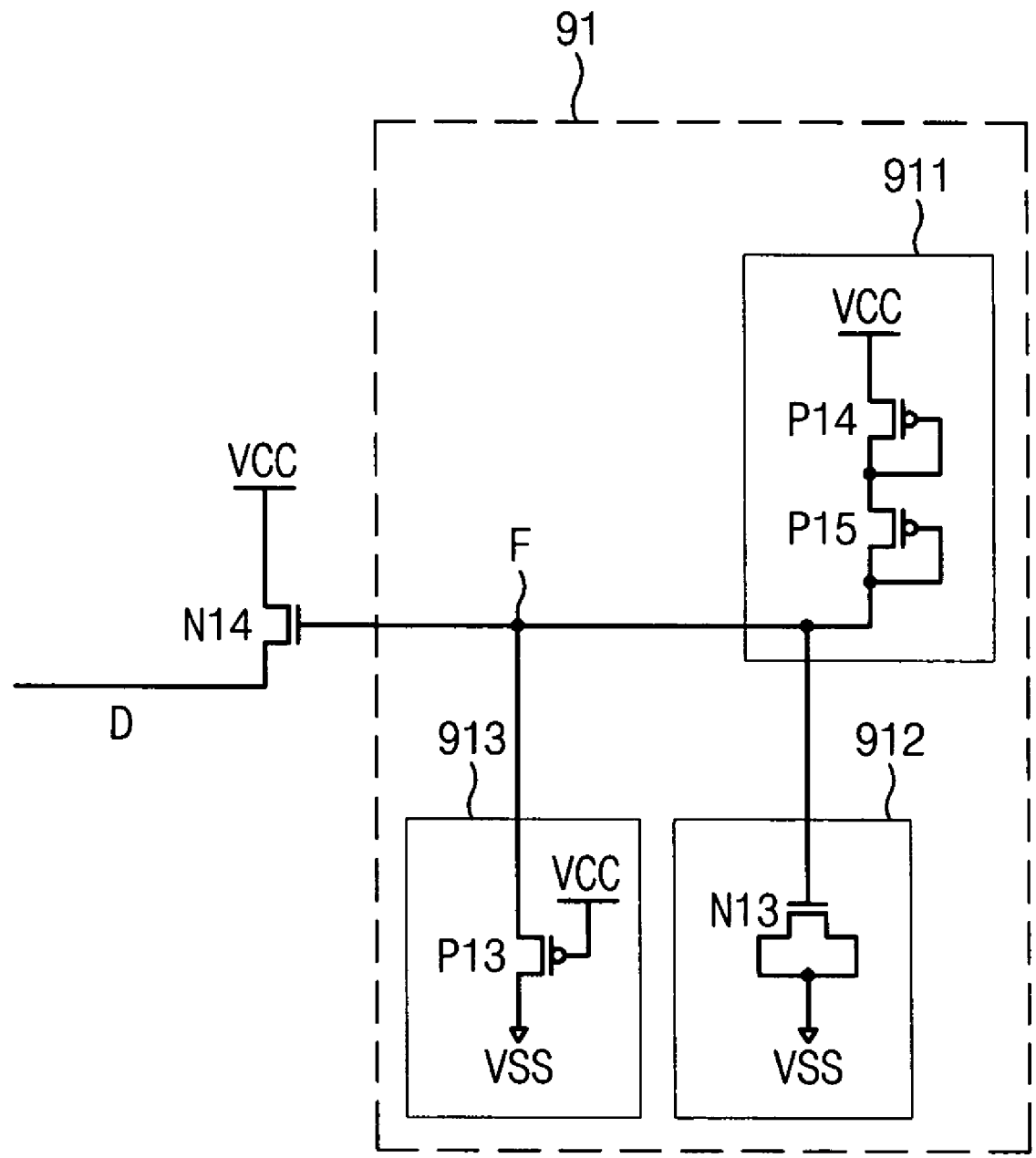
FIG. 11 is a circuit diagram illustrating the temperature compensating circuit in accordance with the present invention.

FIG. 11 is a circuit diagram illustrating the temperature compensating circuit 91 in accordance with the present invention.

The temperature compensating circuit 91 composes the temperature sensing voltage dropping unit 811 of FIG. 9 by using PMOS transistors P14 and P15. The other constitutional elements are identical to FIG. 9. That is, in a temperature sensing voltage dropping unit 911, the PMOS transistors P14 and P15 having their gate and drain terminals commonly connected are connected in series between a power voltage terminal Vcc and a node F.

Here, when a temperature rises and a threshold voltage Vtn of the NMOS transistor N14 decreases as shown in FIG. 4, more current is supplied to the node D by the voltage adjusting unit 34.

However, threshold voltages Vtp of the PMOS transistors P14 and P15 of the temperature sensing voltage dropping unit 911 are heightened due to rise of the temperature, to reduce the voltage of the node E, namely the gate voltage of the NMOS transistor N14. Accordingly, when the threshold voltage Vtn of the NMOS transistor N14 of the voltage adjusting unit 34 is reduced due to rise of the temperature, the temperature compensating circuit 91 decreases the output voltage, thereby compensating for property variations of the elements due to rise of the temperature.

As discussed earlier, in accordance with the present invention, the reset circuit stably generates the reset signal only when the power voltage reaches the predetermined level, regardless of the power-up slope.

Furthermore, the reset circuit includes the temperature compensating circuits to minimize instability of generation of the reset signal due to variations of the operation properties of the constitutional elements by variations of the outside temperature, thereby stably generating the reset signal.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A reset signal generating circuit, comprising:
   a power sensing stabilizing unit for sensing variations of a power voltage, and for outputting a signal proportional to variations of the power voltage until the power voltage reaches a specific level;
   a voltage adjusting unit for dropping the power voltage to a predetermined level, and outputting a first power voltage;
   a feedback control unit for controlling the output from the power sensing stabilizing unit according to the output from the voltage adjusting unit, and for generating a reset signal by pulling down the output signal from the power sensing stabilizing unit when the output from the voltage adjusting unit reaches the specific level;
   a self pull-up driving unit for maintaining a pull-down state of the output from the power sensing stabilizing unit, by pulling up the output from the voltage adjusting unit to a second power voltage level according to a self bias gate voltage, after generation of the reset signal;
   a self pull-up bias unit for outputting the self bias gate voltage according to variations of the power voltage; and
   a self bias unit for dropping the self bias gate voltage at a specific self bias gate voltage level.

2. The circuit of claim 1, wherein the voltage adjusting unit comprises:
   a voltage dropping unit for dropping the power voltage by certain voltage units; and
   a voltage micro-adjusting unit for adjusting the output from the voltage dropping unit by smaller units than the certain voltage units.

3. The circuit of claim 1, wherein the self pull-up driving unit restricts current supply before the power voltage level is smaller than the specific self bias gate voltage level, and pulls up the output from the voltage adjusting unit by beginning to supply current after the power voltage level reaches the specific self bias gate voltage level.

4. The circuit of claim 3, wherein the self pull-up bias unit outputs the power voltage value as the self bias gate voltage.

5. The circuit of claim 4, wherein the self pull-up bias unit is one of a MOS capacitor and a diode.

6. The circuit of claim 1, further comprising a temperature compensating circuit for transmitting a control signal whose magnitude is changed due to variations of a temperature to the voltage adjusting unit in order to compensate for output variations of the voltage adjusting unit due to variations of the temperature.

7. The circuit of claim 6, wherein the voltage adjusting unit is formed by connecting at least one or more MOS transistors in parallel.

8. The circuit of claim 7, wherein the temperature compensating circuit raises or drops gate voltages of the MOS transistors according to variations of the temperature.

9. The circuit of claim 8, wherein, when the MOS transistors are PMOS transistors, the temperature compensating circuit transmits the output voltage proportional to variations of the temperature to the gate terminals of the PMOS transistors, and when the MOS transistors are NMOS transistors, the temperature compensating circuit transmits the output voltage inversely proportional to variations of the temperature to the gate terminals of the NMOS transistors.

10. The circuit of claim 9, wherein the temperature compensating circuit comprises:
    a temperature sensing voltage dropping unit for variably dropping the power voltage according to variations of the temperature, and for outputting a third power voltage to the voltage adjusting unit;
    a voltage stabilizing unit for stabilizing the output from the temperature sensing voltage dropping unit by grounding at the initial stage of the operation; and
    a voltage precharge unit for pulling down the output from the temperature sensing voltage dropping unit in precharge.

11. The circuit of claim 1, further comprising a pull-up control unit for pulling up the output from the power sensing stabilizing unit at an initial stage of the operation, and outputting the output voltage from the power sensing stabilizing unit as the reset signal.

12. The circuit of claim 11, wherein the voltage adjusting unit comprises:
    a voltage dropping unit for dropping the power voltage by certain units; and
    a voltage micro-adjusting unit for adjusting the output from the voltage dropping unit by smaller units than the certain voltage units.

13. The circuit of claim 12, wherein the self pull-up driving unit restricts current supply before the power voltage level is smaller than the specific self bias gate voltage level, and pulls up the output from the voltage adjusting unit by beginning to supply current after the power voltage level reaches the specific self bias gate voltage level.

14. The circuit of claim 13, wherein the self pull-up bias unit outputs a forth power voltage value as the self bias gate voltage.

15. The circuit of claim 14, wherein the self pull-up bias unit is one of a MOS capacitor and a diode.

16. The circuit of claim 11, further comprising a temperature compensating unit for transmitting a control signal whose magnitude is changed due to variations of a temperature to the voltage adjusting unit in order to compensate for output variations of the voltage adjusting unit due to variations of the temperature.

17. The circuit of claim 16, wherein the voltage adjusting unit is formed by connecting at least one or more MOS transistors in parallel.

18. The circuit of claim 17, wherein the temperature compensating circuit raises or drops gate voltages of the MOS transistors according to variations of the temperature.

19. The circuit of claim 18, wherein, when the MOS transistors are PMOS transistors, the temperature compensating circuit transmits the output voltage proportional to variations of the temperature to the gate terminals of the PMOS transistors, and when the MOS transistors are NMOS transistors, the temperature compensating circuit transmits the output voltage inversely proportional to variations of the temperature to the gate terminals of the NMOS transistors.

20. The circuit of claim 19, wherein the temperature compensating circuit comprises:
 a temperature sensing voltage dropping unit for variably dropping the power voltage according to variations of the temperature, and for outputting the power voltage to the voltage adjusting unit;
 a voltage stabilizing unit for stabilizing the output from the temperature sensing voltage dropping unit by grounding at the initial stage of the operation; and
 a voltage precharge unit for pulling down the output from the temperature sensing voltage dropping unit in precharge.

* * * * *